United States Patent
Padiy et al.

(10) Patent No.: US 8,947,643 B2
(45) Date of Patent: Feb. 3, 2015

(54) LITHOGRAPHIC APPARATUS AND METHOD CONTROLLING PARAMETER DRIFT BY PERFORMING MULTIPLE PATTERNING PASSES ON REFERENCE SUBSTRATE

(75) Inventors: Alexander Viktorovych Padiy, Geldrop (NL); Boris Menchtchikov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 756 days.

(21) Appl. No.: 13/010,409

(22) Filed: Jan. 20, 2011

(65) Prior Publication Data

US 2011/0205520 A1 Aug. 25, 2011

Related U.S. Application Data

(60) Provisional application No. 61/306,052, filed on Feb. 19, 2010.

(51) Int. Cl.
   *G03B 27/32* (2006.01)
   *G03F 7/20* (2006.01)
(52) U.S. Cl.
   CPC .................................. *G03F 7/70516* (2013.01)
   USPC ........................................................ 355/77
(58) Field of Classification Search
   CPC ............................ G03F 7/70516; G03F 9/7019
   USPC ..................................................... 355/77, 53
   See application file for complete search history.

(56) References Cited

U.S. PATENT DOCUMENTS

| | | |
|---|---|---|
| 6,645,683 B2 | 11/2003 | Luhn et al. |
| 7,375,799 B2 | 5/2008 | Van De Kerkhof et al. |
| 7,383,095 B2 | 6/2008 | Lee et al. |
| 7,649,614 B2 | 1/2010 | De Mol |
| 2002/0042664 A1 | 4/2002 | Kikuchi |

(Continued)

FOREIGN PATENT DOCUMENTS

| | | |
|---|---|---|
| EP | 1 628 164 A2 | 2/2006 |
| JP | 2002-353121 A | 12/2002 |

(Continued)

OTHER PUBLICATIONS

Shih et al, "A sophisticated metrology solution for advanced lithography; addressing the most stringent needs of today as well as future lithography", Nov. 18-19, 2009, Proceedings of the SPIE, 2009: Lithography Asia 2009, vol. 7520, pp. 75201A-1-75201A-7.*

(Continued)

*Primary Examiner* — Chia-how Michael Liu
(74) *Attorney, Agent, or Firm* — Sterne, Kessler, Goldstein & Fox P.L.L.C.

(57) ABSTRACT

A method produces at least one monitor wafer for a lithographic apparatus. The monitor wafer is for use in combination with a scanning control module to periodically retrieve measurements defining a baseline from the monitor wafer, thereby determining parameter drift from the baseline. In doing this, allowance and/or correction can be to be made for the drift. The baseline is determined by initially exposing the monitor wafer(s) using the lithographic apparatus to perform multiple exposure passes on each of the monitor wafer(s). An associated lithographic apparatus is also disclosed.

20 Claims, 3 Drawing Sheets

(56) References Cited

U.S. PATENT DOCUMENTS

2011/0205511 A1 8/2011 Padiy et al.
2011/0205513 A1 8/2011 Padiy et al.

FOREIGN PATENT DOCUMENTS

| | | |
|---|---|---|
| JP | 2006-135015 A | 5/2006 |
| JP | 2006-190794 A | 7/2006 |
| JP | 2006-344947 A | 12/2006 |
| JP | 2008-544507 A | 12/2008 |
| JP | 2009-164306 A | 7/2009 |
| JP | 2009-231564 A | 10/2009 |
| JP | 2011-187951 A | 9/2011 |
| TW | I225972 B | 1/2005 |
| TW | 200627236 A | 8/2006 |

OTHER PUBLICATIONS

Huang et al, "Using Intra-Field High Order Correction to Achieve Overlay Requirement beyond Sub-40nm Node", Feb. 23-26, 2009, Proceedings of the SPIE, 2009: Metrology, Inspection and Process Control for Microlithography XXIII, vol. 7272, pp. 72720I-1-72720I-9.*

English-Language Abstract for Japanese Patent Publication No. 2006-135015 A, published May 25, 2006; 1 page.

English-Language Abstract for Japanese Patent Publication No. 2006-190794 A, published Jul. 20, 2006; 1 page.

English-Language Abstract for Japanese Patent Publication No. 2009-164306 A, published Jul. 23, 2009; 1 page.

English-Language Abstract for Japanese Patent Publication No. 2009-231564 A, published Oct. 8, 2009; 1 page.

* cited by examiner

LITHOGRAPHIC APPARATUS AND METHOD CONTROLLING PARAMETER DRIFT BY PERFORMING MULTIPLE PATTERNING PASSES ON REFERENCE SUBSTRATE

CROSS REFERENCE TO RELATED APPLICATIONS

This application claims benefit under 35 U.S.C. 119(e) to U.S. Provisional Application No. 61/306,052, filed Feb. 19, 2010, which is incorporated by reference herein in its entirety

FIELD

Embodiments of the present invention relate to methods and apparatus usable, for example, in the manufacture of devices by lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a "mask" or a "reticle," may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called "steppers," in which each target portion is irradiated by exposing an entire pattern onto the target portion at one time, and so-called "scanners," in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidths of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometers are known. Spectroscopic scatterometers direct a broadband radiation beam onto the substrate and measure the spectrum (intensity as a function of wavelength) of the radiation scattered into a particular narrow angular range. Angularly-resolved scatterometers use a monochromatic radiation beam and measure the intensity of the scattered radiation as a function of angle.

In order to better control scanner functionality, a module has been recently devised which automatically drives the system towards a pre-defined baseline approximately each day. This scanner stability module retrieves standard measurements taken from a monitor wafer using a metrology tool. The monitor wafer had been previously exposed using a special reticle containing special scatterometry marks. Using the monitor wafer and that day's measurements (and possibly historical measurement data from previous days), the scanner stability module determines how far the system has drifted from its baseline, and then calculates wafer-level overlay and focus correction sets. The baseline can be defined either directly by the reference layer on the monitor wafer (in this case, the scanner stability module will drive the system towards minimal overlay on the baseline monitor wafers) or indirectly by a combination of the reference layer on the wafers and a target overlay fingerprint (in this case, the scanner stability module will drive the system towards the defined target overlay fingerprint on the monitor wafers). The lithography system then converts these correction sets into specific corrections for each exposure on subsequent production wafers.

The alignment model sequences produce a significant noise source for the scanner stability module controller, which attempts to control the scanner using overlay data from the very limited number of monitor wafers (typically from 4 to 12 wafers per week for each scanner).

SUMMARY

It is desirable to provide a system whereby the scanner stability module control accuracy is improved while still using the same or similar limited number of monitor wafers as present.

According to an aspect of an embodiment of the present invention, there is provided a lithographic apparatus that includes the following: an illumination system configured to condition a radiation beam, a support configured to support a patterning device, the patterning device being capable of imparting the radiation beam with a pattern in its cross-section to form a patterned radiation beam, a substrate table configured to hold a substrate, a projection system configured to project the patterned radiation beam onto a target portion of the substrate, and, a scanning control module operable to aid control of at least one of the support, substrate table or projection system by periodically retrieving measurements defining baseline control parameters from at least one reference substrate so as to determine parameter drift from the baseline control parameters thereby enabling allowance and/or correction to be made for the drift, the reference substrate having been initially exposed so as to determine the baseline control parameters, wherein the apparatus is operable in at least a scanning mode wherein the patterned radiation beam is scanned across the target portion of the substrate, the apparatus being further operable, during the initial exposing of the at least one reference substrate, to perform multiple exposure passes on each of the at least one reference substrates.

According to a second aspect of an embodiment of the present invention, there is provided a method of producing at least one reference substrate for a lithographic apparatus, the reference substrate being usable in combination with a scanning control module which periodically retrieves measurements from the least one reference substrate which define baseline control parameters, so as to aid scanning control during a lithographic process by determining parameter drift from the baseline control parameters, thereby enabling allowance and/or correction to be made for the drift, the baseline control parameters being determined by initially exposing the at least one reference substrate using the lithographic apparatus, the method comprising performing multiple exposure passes on at least one of the one or more reference substrates.

Further features and advantages of embodiment of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate embodiments of the present invention and, together with the description, further serve to explain the principles of embodiments of the invention and to enable a person skilled in the relevant art(s) to make and use embodiments of the present invention.

Figure 1:
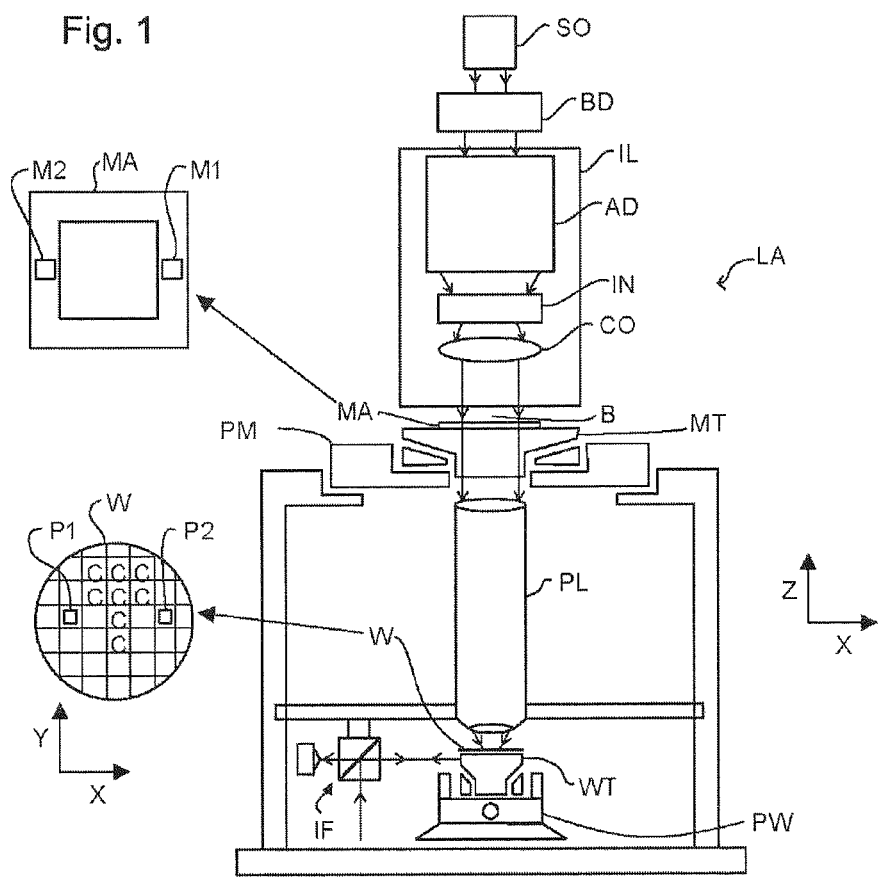
FIG. 1 depicts an example lithographic apparatus, which may be used with embodiments of the present invention.

The features and advantages of embodiments of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the relevant art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include the following: read only memory (ROM); random access memory (RAM); magnetic disk storage media; optical storage media; flash memory devices; and, electrical, optical, acoustical signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts an example lithographic apparatus, which may be used with embodiments of the present invention. The apparatus includes the following an illumination system (illuminator) IL configured to condition a radiation beam B (e.g., UV radiation or DUV radiation), a support structure (e.g., a mask table) MT configured to support a patterning device (e.g., a mask) MA and connected to a first positioner PM configured to accurately position the patterning device in accordance with certain parameters, a substrate table (e.g., a wafer table) WT configured to hold a substrate (e.g., a resist coated wafer) W and connected to a second positioner PW configured to accurately position the substrate in accordance with certain parameters, and a projection system (e.g., a refractive projection lens system) PL configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports (i.e., bears the weight of, the patterning device). It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate such as, for example, if the pattern includes phase-shifting features or so called assist features. Generally, the pattern imparted to the radiation beam will correspond to a particular functional layer in a device being created in the target portion, such as, for example, an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As depicted herein, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure. For example, in one such machine, one table may be used for measurement and alignment (the measure side), while another table may simultaneously be used for exposure (the exposure side).

The lithographic apparatus may also be of a type where at least a portion of the substrate may be covered by a liquid having a relatively high refractive index (e.g., water) so as to fill a space between the projection system and the substrate. An immersion liquid may also be applied to other spaces in the lithographic apparatus such as, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities such as, for example, when the source is an excimer laser. In such cases, the source is not considered to form part of the lithographic apparatus and the radiation beam is passed from the source SO to the illuminator IL with the aid of a beam delivery system BD include, for example, suitable directing mirrors and/or a beam expander. In other cases, the source may be an integral part of the lithographic apparatus such as, for example, when the source is a mercury lamp. The source SO and the illuminator IL, together with the beam delivery system BD (if required) may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components such as, for example, an integrator IN and a condenser CO. The illuminator may be used to condition the radiation beam in order to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately (e.g., so as to position different target portions C in the path of the radiation beam B). Similarly, the first positioner PM and another position sensor (which is not explicitly depicted in FIG. 1) can be used to accurately position the mask MA with respect to the path of the radiation beam B (e.g., after mechanical retrieval from a mask library or during a scan). In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus can be used in at least one of the following modes:

1. In a step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In the step mode, the maximum size of the exposure field limits the size of the target portion C imaged in a single static exposure.

2. In a scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In the scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this other mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device such as, for example, a programmable mirror array of a type as referred to above.

Combinations and/or variations on the above described modes of use or entirely different modes of use may also be employed.

Figure 2:
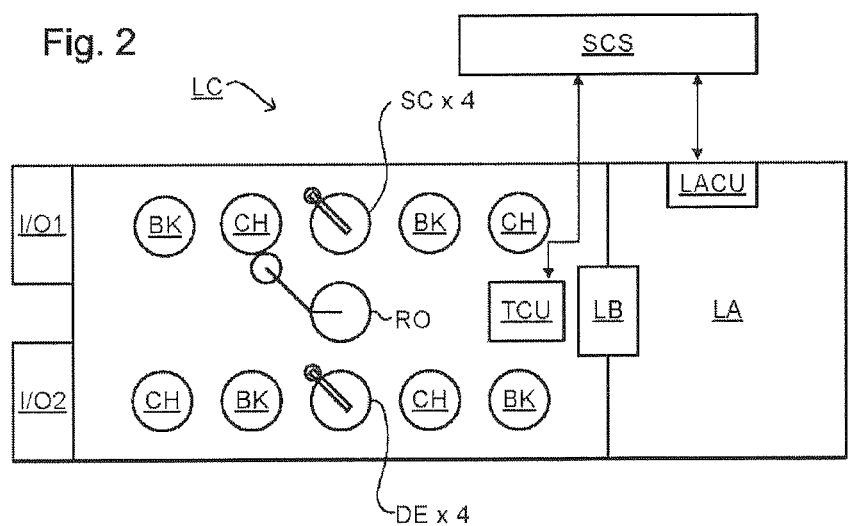
FIG. 2 depicts an example lithographic cell or cluster, which may be used with embodiments of the present invention.

As shown in FIG. 2, the lithographic apparatus LA, which may be used with embodiments of the present invention, forms part of a lithographic cell LC, also sometimes referred to a lithocell or cluster, which also includes an apparatus to perform pre- and post-exposure processes on a substrate. Conventionally, these include spin coaters SC to deposit resist layers, developers DE to develop exposed resist, chill plates CH and bake plates BK. A substrate handler, or robot RO, picks up substrates from input/output ports I/O1, I/O2, moves them between the different process apparatus, and delivers them to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to ensure that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments may be made to exposures of subsequent substrates, especially if the inspection can be done soon and fast enough that other substrates of the same batch are still to be exposed. Also, already exposed substrates may be stripped and reworked (to improve yield) or discarded, thereby avoiding performing exposures on substrates that are known to be faulty. In a case where only some target portions of a substrate are faulty, further exposures can be performed only on those target portions which are considered good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable rapid measurements, it is desirable that the inspection apparatus measure properties in the exposed resist layer immediately after the exposure. However, the latent image in the resist has a very low contrast (there is only a very small difference in refractive index between the parts of the resist which have been exposed to radiation and those which have not) and not all inspection apparatus have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as "semi-latent." It is also possible to make measurements of the developed resist image (at which point either the exposed or unexposed parts of the resist have been removed) or after a pattern transfer step such as etching. The latter possibility limits the possibilities for rework of faulty substrates but may still provide useful information.

Figure 3:
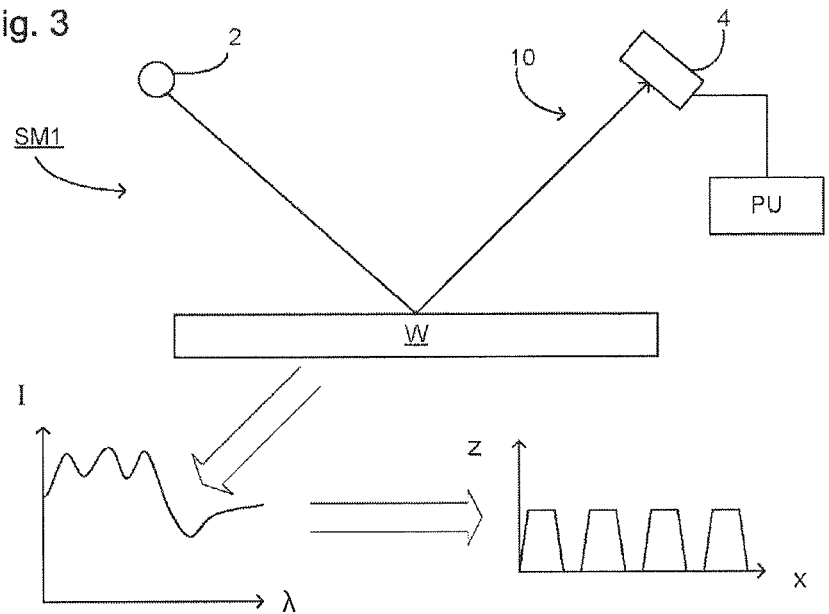
FIG. 3 depicts a first example of a scatterometer, which may be used with embodiments of the present invention.

FIG. 3 depicts an example scatterometer, which may be used in embodiments of the present invention. The scatterometer includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU (e.g., by Rigorous Coupled Wave Analysis and non-linear regression or by comparison with a library of simulated spectra as shown at the bottom of FIG. 3). In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
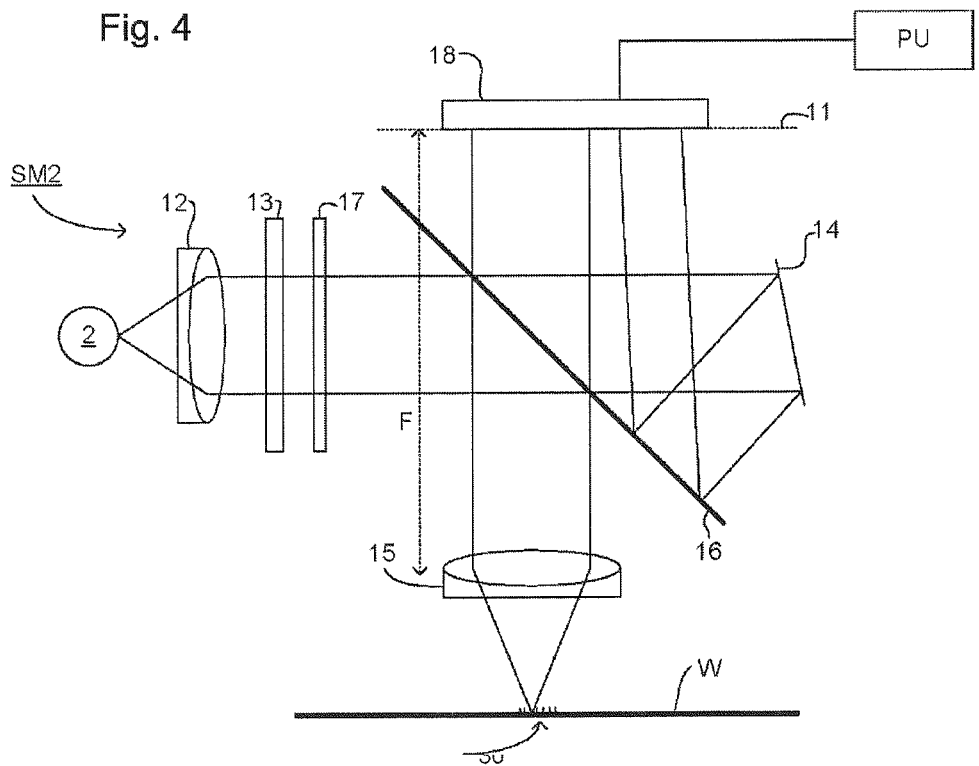
FIG. 4 depicts a second example of a scatterometer, which may be used with embodiments of the present invention.

Another scatterometer that may be used with embodiments of the present invention is shown in FIG. 4. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), preferably at least 0.9 and more preferably at least 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15; however, the pupil plane may instead be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the beam splitter 16, part of it is transmitted through the beam splitter as a reference beam towards a reference mirror 14. The reference beam is then projected onto a different part of the same detector 18 or alternatively onto a different detector (not shown).

A set of interference filters 13 is available to select a wavelength of interest in the range of, for example, 405-790 nm or even lower, such as 200-300 nm. The interference filter may be tunable rather than include a set of different filters. A grating could be used instead of interference filters.

The detector 18 may measure the intensity of scattered light at a single wavelength (or narrow wavelength range), the intensity separately at multiple wavelengths, or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths) is possible, which gives a large etendue, allowing the mixing of multiple wavelengths. The plurality of wavelengths in the broadband preferably each has a bandwidth of $\Delta\lambda$ and a spacing of at least $2 \cdot \Delta\lambda$ (i.e., twice the bandwidth). Several "sources" of radiation can be different portions of an extended radiation source which have been split using fiber bundles. In this way, angle-resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars, or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

A key component of accurate lithography is an increased ability to control lithography scanners and scanning functionality (when referring to "scanners" it should be appreciated that this encompasses all the scan modes and functionality described herein and other scanning functionalities). Improvements to the scanner's focus and overlay (layer-to-layer alignment) uniformity have recently been achieved by the Baseliner™ scanner stability module, leading to an optimized process window for a given feature size and chip application, enabling the continuation the creation of smaller, more advanced chips.

When a lithography system is first installed, it must be calibrated to ensure optimal operation. However, over time, system performance parameters will drift. A small amount of drift can be tolerated, but with too much drift, the system will not likely meet specification. Consequently, manufacturers are required to stop production periodically for re-calibration. Calibrating the system more frequently gives a bigger process window, but consequently, at the cost of more scheduled downtime.

Among other benefits, the scanner stability module greatly reduces these production stoppages. In an embodiment, the scanner stability module automatically drives the system towards a pre-defined baseline on a regular basis (typically every few days). To do this, it retrieves standard measurements taken from one or more monitor wafers using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

For volume production, it is desirable to have full flexibility when assigning layers for exposure to a scanner. The alternative, layer-scanner dedication, would put monthly output capacity at risk, since any small disturbance of the lithocluster would directly appear in the output of that month. One known approach to overcome this risk is by so called (overlay) grid matching. All scanner grids are intentionally offset a little, such that all scanners more or less have the same (average) grid for overlay. This grid is often referred to as 'holy' or 'golden' grid. Each product layer can now be exposed on each scanner of the same type. This 'golden' grid is exposed and etched onto so called 'reference wafers'. If these 'golden' matching wafers are used as the baseline for overlay stability control instead of random monitoring wafers, overlay grid matching and long-term stability can be achieved in a single automated step.

Figure 5:
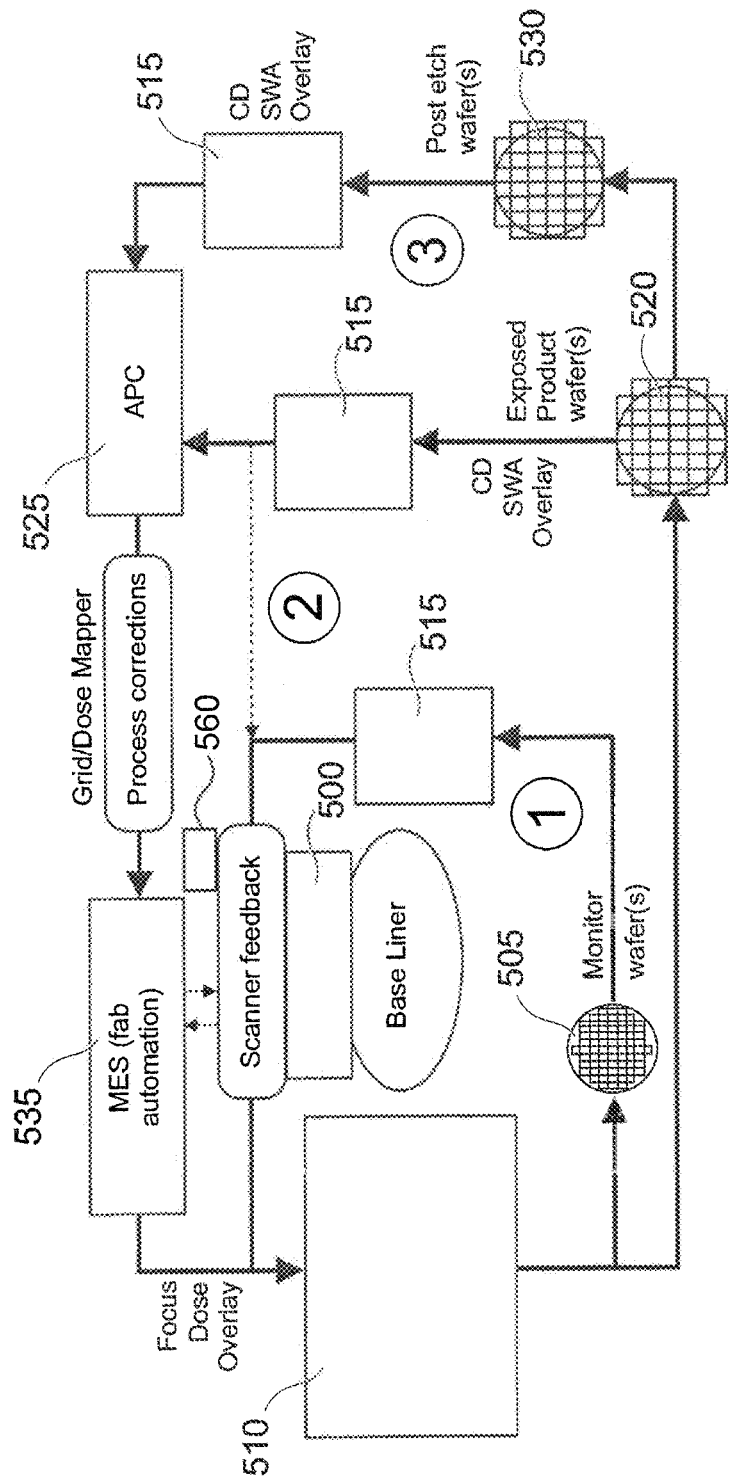
FIG. 5 illustrates an embodiment of control loops in a lithographic process utilizing a scanner stability module.

FIG. 5 depicts an embodiment of the overall lithography and metrology method incorporating the scanner stability module 500 (essentially an application running on a server, in this example). Shown are three main process control loops. In an embodiment, the first loop provides the local scanner control using the scanner stability module 500 and monitor wafers. The monitor wafer 505 is shown being passed from the main lithography unit 510, having been exposed to set the baseline parameters for focus and overlay. At a later time, metrology unit 515 reads these baseline parameters, which are then interpreted by the scanner stability module 500 so as to calculate correction routines so as to provide scanner feedback 550, which is passed to the main lithography unit 510, and used when performing further exposures.

In an embodiment, the second Advanced Process Control (APC) loop is for local scanner control on-product (e.g., determining focus, dose, and overlay). The exposed product wafer 520 is passed to metrology unit 515, where information relating to, for example, the critical dimensions, sidewall angles and overlay is determined and passed onto the Advanced Process Control (APC) module 525. This data is also passed to the scanner stability module 500. Process corrections 540 are made before the Manufacturing Execution System (MES) 535 takes over, providing scanner control to the main lithography unit 510, in communication with the scanner stability module 500.

In an embodiment, the third loop allows metrology integration into the second APC loop (e.g., for double patterning). The post etched wafer 530 is passed to metrology unit 515 which again passes information relating to, for example, the critical dimensions, sidewall angles and overlay, read from the wafer, to the Advanced Process Control (APC) module. The loop continues the same as with the second loop.

In an embodiment, the scanner stability module product definition assumes that scanner stability module monitor wafers are exposed in lot operations using scanner settings that are similar to the settings used for exposing customer product wafers. In particular, this means that the exposure layout of the scanner stability module monitor wafers is similar to the exposure layout of the typical customer product, with no special processing or routines applied.

However, in test software for certain lithography systems (e.g., Twinscan®), dedicated exposure sequences are used for some of the setup tests in order to achieve desired setup accuracy while using only a limited number of wafers for exposure, according to an embodiment of the present invention. For example, multi-meander exposures are used in final XY (FXY) testing that calibrate systematic linear offsets (the so-called blue alignment offsets: BAO's) between the actual in-resist overlay and the overlay expected based on the alignment model (Stage Align/Wafer Align/Reticle Align/Lot Correction-SA/WA/RA/LoCo). In an embodiment, the wafer alignment model determines how alignment results are used to determine the position, rotation and magnification of each exposure.

FXY testing is a calibration test which primarily aims to correct for alignment offset (difference) between wafer and reticle alignment, according to an embodiment of the present invention. During this test, each wafer, after having been loaded and aligned on the measure-side (assuming a multi-stage lithographic machine) proceeds to the exposure side of the machine, whereupon a plurality of exposure meanders are performed, in combination with modulating the light intensity per exposure such that every field gets exposed only once.

Following this, the wafer moves back to measure side for unloading. As this calibration test cannot distinguish between an offset resultant from inconsistency between wafer and reticle alignment and an offset resultant from alignment errors, alignment noise suppression techniques are implemented in this calibration test, according to an embodiment of the present invention.

In the FXY test, each exposure meander is preceded by its own reticle align (RA) test. Therefore the impact of RA reproduction is averaged out, since the RA reproduction is effectively reduced by a factor of 2.5 (for the case of 6-pass exposure). To explain this statistical estimation, assume alignment noise to be 1. The average of 6 alignments would then give noise of 1/sqrt(6), which is approximately 2.5 times smaller than 1. It should be noted that the number of meanders does not need to be 6 and could be any arbitrary value above 1, depending on the application, according to an embodiment of the present invention. Therefore fewer wafers need to be used in FXY testing for achieving the specified BAO calibration accuracy (e.g., 18 wafers would normally be needed when using standard single-pass exposures to achieve the intra-field BAO's accuracy that is achieved by FXY testing on only 3 wafers via the use of 6-pass exposures).

In an embodiment, another way of achieving multi-pass exposure functionality is by means of special tricks such as "virtual load/unload." In this case, a wafer is first loaded and aligned at the measure side. It is then moved it to the exposure side for a first exposure, after which it is returned to the measure side, in the unload position. However, instead of being unloaded, it is simply left in the unload position for a specified period of time, then moved to load position where the process is repeated. This process can be repeated multiple times thus allowing a mimic of the exposure of multiple wafers onto a single wafer.

In an embodiment, the multi-pass exposure functionality is accessible only through the use of dedicated test software. In another embodiment, lot operations interfaces will in principle be able to provide the multi-pass exposure functionality to the lots scheduled.

Relatively high default RA/SA/WA/LoCo reproduction is a significant noise source for the scanner stability module controller attempting to control the scanner using overlay data from the very limited number of monitor wafers (typically from 4 to 12 wafers per week per scanner). In an embodiment, the scanner stability module implementation achieves control accuracy that is sufficient for matched-machine customer usage, but is insufficient for dedicated chuck usage. For example, 2-3 nm scanner stability module control accuracy is small in comparison with matched-machine XT4-1950 overlay of 7 nm (5.5 nm for NXT) but is very significant compared to the XT4-1950 dedicated-chuck overlay of 3.5 nm (2.5 nm for NXT). XT and NXT are different implementations of the Twinscan® apparatus.

Control accuracy could be in principle improved by increasing the number of monitor wafers, but the number of monitor wafers is limited by the availability of the metrology unit, scanner, wafer processing equipment and the customer FAB automation system, according to an embodiment of the present invention. Therefore, noise reduction on the input of the scanner stability module controller should be reduced, so as to improve the scanner stability module control accuracy while still using the limited number of monitor wafers. This may be achieved, in particular, by averaging out the noise that is generated by the scanner while performing SA/WA/RA/LoCo alignment in the process of exposing the monitor wafers.

To do this, an interface, such as interface 560 of FIG. 5, is implemented on the scanner which allows the multiple cycling of each of the monitor wafers through the measure-exposure sequence. This can be done by using a test similar to the FXY test with multi-pass exposures, and/or the above described techniques for virtual wafer load-virtual wafer unload, and/or any other suitable mechanism for providing multi-pass exposure functionality. With such an interface in place, the following method can be performed:

Use a test similar to the FXY test to perform multi-pass exposures on the scanner stability module monitor wafers;

Precede each exposure pass by a standard SA/WA/RA/LoCo sequence. Alternatively, a non-standard sequence may be used. Performing only the reticle align and lot correction may suffice. And/or a non-standard sequence providing increased accuracy, possibly at the cost of throughput may be performed. Such methods are disclosed in co-owned, co-pending U.S. Patent. Appl. Publication No. 2011-0205513, filed Jan. 20, 2011, which is incorporated by reference herein in its entirety. The methods disclosed therein may be used in conjunction with the methods disclosed herein.

Reduce the impact of SA/WA/RA/LoCo reproduction by averaging the overlay measurements (obtained using an inspection/metrology tool such as those using a scatterometer) corresponding to the multiple exposure passes. This may be done in the scanner stability module controller by averaging the SA/WA/RA/LoCo contributions with the aim of separating the calibration offsets that are to be adjusted from the noise;

If required, perform a one-time calibration (either per scanner for each scanner family) to determine possible systematic overlay offsets (e.g., difference in BAOs) between the default single-pass product-like exposure and the multi-pass exposure; and Restrict the use of multi-pass exposures to test software and scanner stability module lots (e.g., make multi-pass available only when scanner stability module-specific lot ID is detected in combination with scanner stability module-specific recipe).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool, and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157, or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

While specific embodiments of the present invention have been described above, it will be appreciated that embodiments of the present invention may be practiced otherwise than as described. For example, embodiments of the present invention, or at least the inventive aspect thereof, may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to embodiments of the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of embodiments of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present invention should not be limited by any of the above-described exemplary embodiments, but should be defined only in accordance with the following claims and their equivalents.

What is claimed is:

1. A lithographic apparatus comprising:
a support configured to support a patterning device;
a substrate table configured to hold a substrate;
a projection system configured to transfer a pattern from the patterning device into a target portion of the substrate; and
a control module configured to periodically retrieve measurements defining baseline control parameters from one or more reference substrates and to determine parameter drift from the baseline control parameters, wherein the control module is further configured to:
perform multiple patterning passes on at least one reference substrate,
precede each one of the multiple patterning passes with an alignment process, and
average overlay measurements corresponding to the multiple patterning passes to reduce impact of the alignment processes.

2. The apparatus of claim 1, wherein a standard alignment model is used for the alignment process; the standard alignment model comprising SA and WA and RA and LoCo settings, wherein SA is stage align for aligning the substrate table, WA is wafer align for aligning the substrate, RA is reticle align for aligning the patterning device and LoCo is lot correction.

3. The apparatus of claim 1, wherein non-standard alignment model settings optimized for accuracy are used for the alignment process.

4. The apparatus of claim 1, further comprising an interface configured to allow the control module to access multiple patterning pass functionality.

5. The apparatus of claim 4 wherein the multiple patterning pass functionality is comprised in a test module for the lithographic apparatus.

6. The apparatus of claim 1, wherein the controller is further configured to perform the multiple patterning passes by performing a test similar to "final XY" test wherein a plurality of patterning passes are performed on the at least one reference substrate such that every target portion undergoes patterning only once.

7. The apparatus of claim 1, wherein the apparatus is operable such that the multiple patterning pass functionality is achieved using "virtual wafer load" and "virtual wafer unload" mechanisms, wherein the substrate is not unloaded at the completion of a patterning pass, but is treated as though it is a newly loaded substrate.

8. The apparatus of claim 1, further comprising an inspection device incorporating a scatterometer for the periodic retrieval of baseline measurements and/or for measuring overlay on the one or more reference substrates.

9. The apparatus of claim 1, wherein the apparatus is operable to perform a one-time calibration to determine possible systematic overlay offsets between a default single-pass transfer and a multi-pass transfer.

10. The apparatus of claim 1, wherein the apparatus is operable to perform projection lithography, further comprising:
an illumination system configured to condition a radiation beam,
wherein the patterning device is capable of imparting the radiation beam with a pattern in its cross-section to form a patterned radiation beam and the projection system is configured to project the patterned radiation beam onto the target portion of the substrate to perform the patterning.

11. The apparatus of claim 10, wherein the apparatus is operable in at least a scanning mode wherein the patterned radiation beam is scanned across the target portion of the substrate.

12. A method of producing at least one reference substrate for a lithographic apparatus, the reference substrate being usable in combination with a control module which periodically retrieves measurements from the least one reference substrate which define baseline control parameters, so as to aid scanning control during a lithographic process by determining parameter drift from the baseline control parameters,
performing multiple patterning passes on the at least one reference substrate, the multiple patterning passes comprising applying a pattern repeatedly at a plurality of target portions of the at least one reference substrate;

performing an alignment process prior to each one of the multiple patterning passes; and averaging overlay measurements corresponding to the multiple patterning passes to reduce impact of the alignment processes.

13. The method of claim 12, wherein a standard alignment model is used for the alignment, the standard alignment model comprising SA and WA and RA and LoCo settings, wherein SA is stage align for aligning the substrate table, WA is wafer align for aligning the substrate, RA is reticle align for aligning the patterning device and LoCo is lot correction.

14. The method of claim 12, wherein non-standard alignment model settings optimized for accuracy are used for the alignment.

15. The method of claim 12, wherein the multiple patterning pass functionality is comprised in functionality normally used in performing test routines on the lithographic apparatus.

16. The method of claim 12, wherein the performing multiple patterning passes comprises performing a test similar to "final XY" test wherein a plurality of patterning passes are performed on the at least one reference substrate such that every target portion undergoes patterning only once.

17. The method of claim 12, wherein the multiple patterning pass functionality is achieved using "virtual wafer load" and "virtual wafer unload" mechanisms wherein the substrate is not unloaded at the completion of a patterning pass, but is treated as though it is a newly loaded substrate.

18. The method of claim 12, wherein the periodic retrieval of baseline measurements is performed using an inspection device incorporating a scatterometer.

19. The method of claim 12, further comprising:
performing a one-time calibration to determine possible systematic overlay offsets between a default single-pass transfer and a multi-pass transfer.

20. A non-transitory computer program product comprising a computer program operable to cause a lithography apparatus to carry out the method comprising:
producing at least one reference substrate for a lithographic apparatus, the reference substrate being usable in combination with a control module which periodically retrieves measurements from the least one reference substrate which define baseline control parameters, so as to aid scanning control during a lithographic process by determining parameter drift from the baseline control parameters;

performing multiple patterning passes on the at least one reference substrate, the multiple patterning passes comprising applying a pattern repeatedly at a plurality of target portions of the at least one reference substrate;

performing an alignment process prior to each one of the multiple patterning passes; and averaging overlay measurements corresponding to the multiple patterning passes to reduce impact of the alignment processes.

* * * * *

UNITED STATES PATENT AND TRADEMARK OFFICE
CERTIFICATE OF CORRECTION

PATENT NO. : 8,947,643 B2  
APPLICATION NO. : 13/010409  
DATED : February 3, 2015  
INVENTOR(S) : Padiy et al.

Page 1 of 1

It is certified that error appears in the above-identified patent and that said Letters Patent is hereby corrected as shown below:

In the Claims

In column 13, line 59, claim 1, please delete "into" and insert --onto--.
In column 14, line 7, claim 2, please delete ";" and insert --,--.
In column 14, line 63, claim 12, after "parameters," please insert --the method comprising--.

Signed and Sealed this
Eighth Day of September, 2015

Michelle K. Lee
*Director of the United States Patent and Trademark Office*